United States Patent [19]

Murakami et al.

[11] Patent Number: 5,283,118

[45] Date of Patent: Feb. 1, 1994

[54] METALLIZED WRAPPING FILM

[75] Inventors: Masatsugi Murakami, Moriyama; Junya Sato, Kouka; Kikuji Sasaki, Otsu; Kazuhoshi Aoyama, Tsuchiura, all of Japan

[73] Assignee: Toray Industries, Inc., Tokyo, Japan

[21] Appl. No.: 900,232

[22] Filed: Jun. 17, 1992

[30] Foreign Application Priority Data

Jun. 17, 1991 [JP] Japan ................................. 3-144945
Jun. 26, 1991 [JP] Japan ................................. 3-154695

[51] Int. Cl.$^5$ ....................... B32B 7/12; B32B 15/04
[52] U.S. Cl. ...................................... 428/349; 428/343; 428/344; 428/354; 428/356; 428/457; 428/458
[58] Field of Search .............. 428/354, 343, 344, 356, 428/349

[56] References Cited

U.S. PATENT DOCUMENTS

| | | | |
|---|---|---|---|
| 4,125,446 | 11/1978 | Hartsough et al. | 204/192 P |
| 4,241,129 | 12/1980 | Marton et al. | 428/344 |
| 4,305,111 | 12/1981 | Forster | 361/273 |
| 4,308,084 | 12/1991 | Ohtusuki et al. | 428/344 |
| 4,629,640 | 12/1986 | Akao | 428/354 |
| 5,017,429 | 5/1991 | Akao | 428/354 |

*Primary Examiner*—George F. Lesmes
*Assistant Examiner*—Kathryne Elaine Shelborne
*Attorney, Agent, or Firm*—Fish & Richardson

[57] ABSTRACT

A metallized wrapping film having low water vapor transmittance and low oxygen transmittance, in which the adhesion of the metallic layer to the base film is strong, and which has heat-sealing property is disclosed. The metallized wrapping film according to the present invention comprises a plastic base film; a heat-sealing layer formed on one surface of said base film; and a metallic layer formed on one surface of said base film opposite to said surface on which said heat-sealing layer is formed, said metallic layer consists essentially of 70-99% by weight of aluminum and one or more elements selected from the elements having an atomic number of 12-30 excluding aluminum.

10 Claims, 1 Drawing Sheet

METALLIZED WRAPPING FILM

BACKGROUND OF THE INVENTION

1. Field of the Invention

This invention relates to a metallized film suited as a wrapping film.

2. Description of the Related Art

Since plastic films have good mechanical properties and are highly planar, they are metallized and used as wrapping films.

However, the conventional metallized film used for wrapping have drawbacks in that the adhesion between the metallic layer and the base plastic film is weak, so that the portions of the metallic layer may be embossed or peeled off due to abrasion. Further, because the metallic layer is not well adhered to the plastic base film, the metallic film may be peeled off due to the blocking at high temperature and high humidity (in summer time) and the metallic luster of the metallic layer may become dull. Still further, since the conventional metallized wrapping films do not prevent the permeation of water vapor and/or oxygen very well, if they are used as wrapping films for crispy foods such as potato chips, crackers and rice crackers, the foods become humid and/or turn bad because of oxidation in a comparatively short time.

To overcome these problems, some proposals have been made and described in, for example, Japanese Laid-open Patent Application (Kokai) No. 47-29463 and Japanese Patent Publication (Kokoku) Nos. 63-54541 and 2-41344. However, even in these improved metallized films, the adhesion between the metallic layer and the base plastic film is not sufficient or the process for promoting the adhesion is complicated, or the prevention of permeation of water vapor and/or oxygen is not sufficient.

On the other hand, metallized films for metallized capacitors in which aluminum and other elements are deposited are disclosed in Japanese Laid-open Patent Application (Kokai) Nos. 53-81941, 53-85365 and 55-105319. However, since the metallized films are for capacitors, the permeability of water vapor and oxygen of these films are not mentioned at all, and, needless to say, they have no suitable heat-sealing layer so that they are not suitable as wrapping films.

SUMMARY OF THE INVENTION

Accordingly, an object of the present invention is to provide a metallized film which has good adhesion between the metallic layer and the base plastic film, so that the embossment or peeling off of the metallic layer does not substantially occur due to the abrasion during the manufacturing or processing of the film, and which highly prevents the permeation of water vapor and oxygen.

The present inventors intensively studied to find that the above-mentioned object may be attained if aluminum and another specific element are deposited in a specific ratio on the base plastic film so as to constitute the metallic layer, thereby completing the present invention.

That is, the present invention provides a metallized film comprising a plastic base film; a heat-sealing layer formed on one surface of the base film; and a metallic layer formed on one surface of the base film opposite to the surface on which the heat-sealing layer is formed, the metallic layer consisting essentially of 70-99% by weight of aluminum and one or more elements selected from the elements having an atomic number of 12-30 excluding aluminum.

The metallized film according to the present invention has good adhesion between the metallic layer and the base plastic film, so that the embossment or peeling off of the metallic layer does not substantially occur due to the abrasion during the manufacturing or processing of the film. Further, the metallized film of the present invention highly prevents the permeation of water vapor and oxygen, and the outer appearance of the film is good. Therefore, the metallized film according to the present invention is suited as a wrapping film for wrapping crispy snack foods such as potato chips, crackers and rice crackers.

DETAILED DESCRIPTION OF THE PREFERRED EMBODIMENTS

Figure 1:
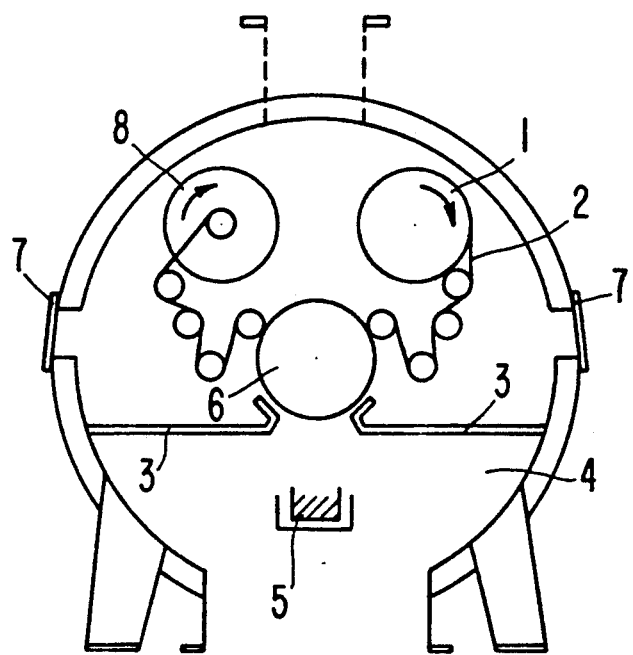
FIG. 1 schematically shows a winding type metallizing apparatus which may preferably be employed for preparing the metallized film according to the present invention.

The base plastic film which is employed in the present invention may be any plastic film conventionally used in the field of wrapping films. Thus, the plastics which may be used as the base film in the present invention include polyolefins, polyesters such as polyethylene terephthalate, polyamides and polyvinyl chlorides. Among these, polyolefin films having low densities are preferred since their light weights are advantageous in manufacturing and processing of the films as well as in distribution of the final products. Among the polyolefins suitable for constituting the plastic base film, polypropylenes, polyethylenes, ethylene/propylene copolymers, polybutenes, propylene/butene copolymers, ethylene/propylene/butene copolymers, as well as mixtures thereof are especially preferred. Although the film may be a non-oriented film, in view of the mechanical strength and processability, oriented films, especially biaxially oriented films are preferred. Especially, biaxially oriented polypropylene-based films containing polypropylene as a major constituent (not less than 80% by weight) are preferred.

The thickness of the plastic base film may usually be 4-100 $\mu$m, preferably 10-40 $\mu$m.

The plastic base film may be a single film or a laminate film. As the laminate film, a film having a base layer of a polypropylene-based polymer containing polypropylene as a major constituent and a surface layer consisting essentially of a polypropylene having a viscosity or a crystallinity which is different from that of the base layer; and a film having a base layer of a polypropylene-based polymer containing polypropylene as a major constituent and a surface layer consisting essentially of an olefin copolymer are preferred. In the latter case, as the olefin copolymer, binary or ternary copolymers containing ethylene, propylene and/or butene, as well as mixtures thereof are preferred. As the binary copolymers, those containing 0.5-20% by weight, more preferably 0.5-8% by weight of ethylene and those containing 0.5-30% by weight, more preferably 0.5-10% by weight of butene (the balance is propylene) are preferred. As the ternary copolymers or blended copolymers, those containing 0.5-30% by weight of ethylene and 0.5-30% by weight of butene, more preferably 0.5-10% by weight of ethylene and 0.5-10% by weight of butene (the balance is propylene) are preferred. The laminate film may be prepared by co-extruding the base layer and the surface layer; by laminating the surface layer on the uniaxially oriented base layer and then stretching the laminate in the direction perpendicular to the firstly stretched direction; or by forming the surface layer by extruding the surface layer on the biaxially oriented base layer. Among these methods, the co-extrusion of the base layer and the surface layer is best preferred. The thickness of the surface layer may usually be 0.1-25 μm and preferably 0.5-3 μm. It should be noted that in cases where the above-described surface layer is laminated on the base layer, the metallic layer hereinbelow described is deposited on the surface layer.

Alternatively, an acrylic polymer may preferably be coated on one surface of the plastic base film. Preferred acrylic polymers which may be coated on one surface of the plastic base film include binary, ternary or quaternary copolymers among the following components and mixtures of the following components:

(i) polymethacrylic acid and/or methyl ester thereof and/or ethyl ester thereof;

(ii) polyacrylic acid and/or methyl ester thereof and/or ethyl ester thereof; and (iii) a copolymer among acrylamide and ethyl acrylate and/or styrene and/or methacrylic acid, as well as a copolymer obtained by reacting formaldehyde and butanol with this copolymer.

The preferred ratio among these components (i), (ii) and (iii) in the copolymer or mixture may be 50-95 wt % of (i), 5-50 wt % of (ii) and 0-10 wt % of (iii).

The acrylic polymer coating may be formed by coating an emulsion of the copolymer or mixture of copolymers (solid content: 30-5% by weight) on the plastic film. The emulsion may be coated on a non-oriented film and then the film may be biaxially oriented, or the emulsion may be coated on a uniaxially oriented film and then the film may be stretched in the direction perpendicular to the firstly stretched direction, or the emulsion may be coated on a biaxially oriented film. Among these, the method in which the emulsion is coated on a uniaxially oriented film and then the film is stretched in the direction perpendicular to the firstly stretched direction in a tenter is best preferred because the thickness of the coating can be made small and the stretching equipment is not stained with the emulsion. The coating of the emulsion may be carried out by any conventional method such as that employing gravure roll coater, flexo coater, reverse roll coater, squeeze roll coater, tension kiss coater or wire-wound bar. The thickness of the coating may preferably be 0.01-2 μm.

On one surface of the plastic base film, a heat-sealing layer is formed. The heat-sealing layer per se is well-known in the art and is described in, for example, Japanese Laid-open Patent Application (Kokai) No. 56-53064. That is, as the heat-sealing layer, ethylene/ethyl acrylate copolymers, ethylene/methyl methacrylate copolymers, ethylene/vinyl acetate copolymers, polyethylenes, ethylene/propylene copolymers, polybutenes, ethylene/butene copolymers, propylene/butene copolymers, and ethylene/propylene/butene copolymers, as well as mixtures thereof are preferred. Among these, mixtures of an ethylene/propylene copolymer and an ethylene/butene copolymer; and ethylene/propylene/butene ternary copolymers are especially preferred. In these cases, the total content of ethylene may preferably be 0.5-20% by weight, more preferably 1-10% by weight, and the total content of butene may preferably be 1-30% by weight, more preferably 1-10% by weight (the balance is propylene).

The thickness of the heat-sealing layer may usually be 1-20 μm and preferably 2-10 μm.

The heat-sealing layer may be laminated on the base film by co-extruding the base film and the heat-sealing layer; by laminating the heat-sealing layer on a uniaxially oriented base film and then stretching the resultant in the direction perpendicular to the firstly stretched direction of the base film; or by extrusion-laminating the heat-sealing layer on a biaxially oriented base film.

The surface of the plastic base film opposite to the heat-sealing layer is metallized. The metallic layer formed on the surface of the plastic base film opposite to the heat-sealing layer consists essentially of 70-99% by weight of aluminum and one or more elements selected from the elements having an atomic number of 12-30 excluding aluminum. The elements having an atomic number of 12-30 are from Mg to Zn in the periodic table. Among these elements, Mg, Si, Ca, Ti, Fe, Co, Ni, Cu and Zn are preferred and Mg, Si and Cu are more preferred. The element having an atomic number of 12-30 excluding aluminum, which constitutes the metallic layer together with aluminum is hereinafter referred to as "prescribed element" for short.

As the aluminum metal used as a source of the metallization may preferably have a purity of not less than 99.9% by weight, more preferably not less than 99.99% by weight. Aluminum and the prescribed element may be deposited from separate metallization sources each containing the simple substances. Alternatively, a mixture of aluminum and the prescribed element or an alloy between aluminum and the prescribed element may also be used as the metallization source. Still alternatively, aluminum on which the prescribed element is plated, or the prescribed element on which aluminum is plated may be used as the metallization source.

The metallic layer formed on the plastic base film by the metallization should contain aluminum in an amount of 70-99% by weight, more preferably 80-95% by weight. If the content of aluminum is smaller than 70% by weight, the metallic luster and the outer appearance of the metallized film may be deteriorated.

The method for metallization is not restricted and vacuum vapor-deposition method (batch method and continuous method), ion-plating method, sputtering method, plasma method and beam method may be employed.

Aluminum and the prescribed element may be deposited simultaneously or sequentially. In cases where they are deposited simultaneously, a mixture of aluminum and the prescribed element may be used as a deposition source, or aluminum and the prescribed element may be melted in separate crucibles and then simultaneously deposited. In cases where aluminum and the prescribed element are sequentially deposited, it is preferred that the uppermost region of the metallic layer is made of aluminum in view of the outer appearance.

The metallic layer thus formed may preferably have a thickness which attains an optical density of the entire film of 1.0-3.0, more preferably 1.5-2.5. If the optical density is lower than 1.0, the shielding of rays is insufficient, so that the content enclosed by the wrapping film may be deteriorated, and so the metallized film is not suitable as a wrapping film. Further, the film has a poor metallic luster. On the other hand, if the optical density of the film is more than 3.0, the metallic layer is unnecessarily thick, the film is likely to be heat-deteriorated, the film may have poor metallic luster, and the surface of the film may become irregular.

The metallized film having the heat-sealing layer may preferably have a water vapor transmittance of not more than 0.025 g/(100 inch$^2$·24 hrs·18 μm) (This means that the weight of water vapor transmitted through the film having a thickness of 18 μm is not more than 0.025 g per 100 inch$^2$ per 24 hours), and an oxygen transmittance of not more than 5 ml/(100 inch$^2$·24 hrs·18 μm). If the metallized film has a water vapor transmittance and oxygen transmittance within the range just mentioned above, the deterioration of the content enclosed by the metallized film due to the oxidation or humidification of the content, as well as the deterioration of the quality or taste of the content due to the evaporation of water or alcohol contained in the content may effectively be prevented.

In cases where the metallization is carried out by vapor-deposition, if the grain size of the deposited metal is not less than 0.045 μm, preferably not less than 0.055 μm, the permeation of water vapor and oxygen may be more prevented. The grain size may be controlled by the vapor-deposition conditions. That is, the above-mentioned grain size may be attained by setting the degree of vacuum to not more than $9 \times 10^{-4}$ Torr, preferably not more than $3 \times 10^{-4}$ Torr, still more preferably not more than $1 \times 10^{-5}$ Torr, and by setting the temperature of the cooling can to $-20°$ to $30°$ C., preferably $0°$ to $30°$ C., still more preferably $0°$ to $20°$ C. The grain size may also be controlled by the chemical composition of the surface of the base film on which the metal is deposited. That is, to attain the desired grain size, the surface of the base film to be metallized may preferably be polypropylene or propylene/ethylene copolymer (ethylene content of 0.5–4% by weight). Especially, polymers which do not contain additives in a large amount and those which do not substantially contain aliphatic acid amide (the content is not more than 0.05% by weight) are preferred. The above-mentioned coating of the acrylic polymer is also preferred to attain the desired grain size.

A preferred example of the process of preparing the metallized film according to the present invention will now be described referring to the drawing. It should be noted, however, the process hereinbelow described is only one example and various other methods may be employed for preparing the metallized film of the present invention.

Polypropylene as the material of the plastic base film is fed in an extruder and ethylene/propylene copolymer as the material of the heat-sealing layer is fed in another extruder. The polymers are melted at $220°$–$300°$ C. in each extruder and introduced into a single die, followed by co-extrusion. The co-extruded polymers are contacted with a cooling drum to prepare a single sheet. The obtained sheet is then stretched in the longitudinal direction at a stretching ratio of 3–7 times the original length at $110°$–$150°$ C., and the obtained uniaxially stretched film is then stretched in the transverse direction in a tenter at a stretching ratio of 5–15 times the original length at $150°$–$180°$ C. The resultant is then heat-set ($110°$–$160°$ C.) to obtain a biaxially oriented film.

The surface opposite to the heat-sealing layer is then subjected to corona discharge treatment in the air or in a specific atmosphere such as nitrogen, carbon dioxide, argon or mixtures thereof. The corona discharge treatment in such a specific atmosphere is preferred. After the corona discharge treatment, the film is wound into a wide roll and then slit into a width suitable for feeding the film in a metallization apparatus. After the slitting, the film is wound into a roll again.

The roll of the film is set to an unwinding axis 1 in a winding type vacuum vapor-deposition apparatus shown in FIG. 1, such that the surface to be metallized is the surface subjected to the corona discharge treatment. The film 2 is wound by a winding axis 8 via a cooling can 6. The deposition chamber 4 is evacuated with a vacuum pump (not shown) to attain a degree of vacuum of $9 \times 10^{-4}$–$1 \times 10^{-7}$ Torr. A crucible 5 containing aluminum and the prescribed element is heated to $900°$–$3000°$ C. and the film 2 is made to run at a velocity of 100–500 m/min. The temperature of the cooling can 6 is set to $-30°$ C. to $40°$ C. Under these conditions, the metallized film of the present invention may be obtained. In view of the good outer appearance of the deposited layer and in view of the low water vapor transmittance, a degree of vacuum of not more than $1 \times 10^{-5}$ Torr and a cooling can temperature of $-20°$ C. to $30°$ C. are preferred. In FIG. 1, reference numeral 3 denotes a barrier plate and reference numeral 7 denotes a window.

The film of the present invention is suitably used as a wrapping film. The film may be used as it is or after being laminated with another film on which printing or the like is made.

The methods for determining or evaluating various properties of the film, which are employed in the Examples and Comparative Examples later described, will now be described.

A. Adhesiveness of Metallic Layer

To the metallic layer, an adhesive cellophane tape (commercially available from Nichiban Co., Ltd.) is pressed and then quickly peeled off to the direction parallel to the metallic layer and along the direction at 180° from the longitudinal direction of the adhesive tape. After the peeling off, the percentage of the area of the metallic layer remaining on the base film was measured. The adhesion of the metallic layer was rated into 6 ranks according to the criteria shown in Table 1.

TABLE 1

| Percent Area of Remaining Metallic Layer | Adhesion Index of Metallic Layer |
| --- | --- |
| 100% | 5 |
| not less than 95% and less than 100% | 4.5 |
| not less than 90% and less than 95% | 4 |
| not less than 75% and less than 90% | 3 |
| not less than 50% and less than 75% | 2 |
| less than 50% | 1 |

B. Water Vapor Transmittance

The water vapor transmittance (g/(100 inch$^2$·24 hrs·18 μm)) was determined at 39° C., 90% RH using a tester for water vapor transmittance PERMATRAN-W1 commercially available from MOCON Co., Ltd. The smaller the value, the higher the prevention of permeation of water vapor.

C. Oxygen Transmittance

The oxygen transmittance (ml/(100 inch$^2 \cdot$24 hrs$\cdot$18 $\mu$m)) was determined at 20° C., 0% RH using a tester for oxygen transmittance OX-TRAN2/20 commercially available from MOCON Co., Ltd. The smaller the value, the higher the prevention of permeation of oxygen.

D. Outer Appearance of Metallic Layer

The outer appearance of the metallic layer was observed with eyes and the outer appearance was rated according to the following criteria:

○: No irregularities are seen in the metallic luster and the metallic luster is excellent Δ: Small color change due to heat deterioration occurs and the metallic luster is slightly inferior X: The outer appearance of the metallic layer is irregular due to color change, tinging with yellow, heat deterioration or the like, and the metallic luster is bad E. Optical Density Optical density (OD) is defined by the following equation:

$$OD = \log(I_O/I)$$

(wherein $I_O$ means the intensity of the light impinging to the sample, and I means the intensity of the light after transmitting the sample)

The optical density was measured with a Macbeth photometer.

F. Heat-sealing Strength

The heat-sealing layer of a sample film was heat-sealed with the heat-sealing layer of another piece of the same sample under the following conditions and the peeling strength (g) per 1 cm width is defined as the heat-sealing strength.

Heat-sealing Conditions:
Sealing Pressure: 1.4 kg/cm$^2$
Sealing Time: 0.5 second
Hot Plate: flat metal/silicone rubber
Temperature: heating one surface at 125° C.

G. Suitability as Wrapping Film

A biaxially oriented polypropylene film and a metallized sample film was extrusion-laminated using polyethylene layer (15 $\mu$m) to obtain a laminate film with a total thickness of 60 $\mu$m. The laminate film was made into a sack by utilizing the heat-sealing layer. In cases where the film does not have a heat-sealing layer, polyethylene was laminated on the surface opposite to the metallic layer so as to form a heat-sealing layer. Rice crackers were sealed in the sack and stored at 40° C., 90% RH for 40 days. Thereafter, the outer appearance and the taste of the rice crackers were examined. The suitability of the sample film as a wrapping film is rated into 4 ranks according to the following criteria:

⊚: The outer appearance and taste are not changed at all

○: The outer appearance and taste are almost not changed

Δ: The outer appearance and taste are little changed

X: Crispness is lost and the taste turned bad

The invention will now be described by way of examples thereof. It should be noted that the examples are presented for the illustration purpose only and should not be interpreted in any restrictive way.

EXAMPLE 1

Polypropylene pellets (melt flow rate (MFR): 2 g/10 minutes) for forming the base layer were fed into an extruder I, ethylene/propylene copolymer (ethylene content: 2% by weight, MFR 6.5 g/10 minutes) for forming the surface layer to be metallized was fed into an extruder II and ethylene/propylene/butene copolymer (ethylene content: 3% by weight; butene content: 4.5% by weight) for forming the heat-sealing layer was fed into an extruder III. Using a three-layered die, the polymers were extruded at 270° C. such that the copolymer layers are formed on each side of the polypropylene base film. The extruded sheet was wound about a cooling drum having a surface temperature of 40° C. so as to solidify the sheet. The resulting sheet was stretched in the longitudinal direction at 125° C. at a stretching ratio of 4.5 times the original length and the resultant was stretched in the transverse direction in a tenter at 165° C. at a stretching ratio of 10 times the original length, followed by heat-setting at 160° C. allowing 5% of relaxation to obtain a film with a thickness of 18 $\mu$m. The thus obtained laminate film had a polypropylene base layer (14 $\mu$m), an ethylene/propylene copolymer layer (surface layer to be metallized) having a thickness of 1 $\mu$m, and an ethylene/propylene/butene copolymer layer (heat-sealing layer) having a thickness of 3 $\mu$m.

Then the surface layer to be metallized was subjected to corona discharge treatment in N$_2$/CO$_2$ atmosphere with an electric energy of 15 W$\cdot$min/m$^2$. On the thus treated surface, a mixture of aluminum (94.5% by weight) and silicon (5.5% by weight) was vapor-deposited using a winding type vacuum vapor-deposition apparatus. In the vacuum vapor-deposition process, the degree of vacuum in the vacuum chamber was $1 \times 10^{-5}$ Torr, the temperature of the cooling can was $-10°$ C. and the film speed was 300 m/min. By this process, a metallized film having an optical density of 2.0 was obtained.

The evaluation results of the properties of the thus obtained film are shown in Table 2. As shown in Table 2, since Al and Si are deposited, this metallized film exhibits excellent prevention of permeation of water vapor and oxygen, and the adhesion and the outer appearance of the metallic layer were good. Further, this film has a heat-sealing layer exhibiting strong heat-sealing property. Thus, by virtue of the combination of the low transmittances of water vapor and oxygen and strong heat-sealing property, this film is suited as a wrapping film.

EXAMPLE 2

Polypropylene pellets (MFR 2 g/10 minutes) for forming the base layer were fed into an extruder I, and ethylene/propylene/butene copolymer (ethylene content: 3% by weight; propylene content: 4.5% by weight) for forming the heat-sealing layer was fed into an extruder II. Using a bilayer die, these polymers were extruded at 270° C. such that the films are laminated to form a sheet. The sheet was wound about a cooling drum having a surface temperature of 40° C. so as to solidify the sheet. The resulting sheet was then stretched in the longitudinal direction at 125° C. at a stretching ratio of 4.5 times the original length. On the exposed surface of the base layer, corona discharge treatment was performed and then 20 wt % emulsion of an acrylic polymer (methyl methacrylate 65 wt %, ethyl acrylate 30 wt %, methyl methacrylate 3 wt %, methylol acrylamide 2 wt %) was coated on the treated surface with a wire-wound bar. The resulting film was stretched in the transverse direction in a tenter at 165°

C. at a stretching ratio of 10 times the original length, followed by heat-setting at 160° C. allowing 5% relaxation to obtain a film having a thickness of 18 μm. The thus obtained laminate film had a polypropylene base layer having a thickness of 14.8 μm an ethylene/propylene/butene copolymer layer (heat-sealing layer) with a thickness of 3 μm and a coating layer with a thickness of 0.2 μm. After performing corona discharge treatment in the air on the polyacrylic coating layer, the polyacrylic coating layer was metallized with aluminum and silicon in the same manner as in Example 1 to obtain a metallized film having an optical density of 2.1.

The results of evaluation of the properties of this film are shown in Table 2. As shown in Table 2, although the adhesion of the metallic layer is little weak, the film can be used as a practical wrapping film and the prevention of permeation of water vapor and oxygen was very good.

EXAMPLE 3

Polypropylene pellets (MFR 2 g/10 minutes) for forming the base film were fed into an extruder I, and ethylene/propylene/butene copolymer (ethylene content: 3% by weight; propylene content: 4.5% by weight) for forming the heat-sealing layer was fed into an extruder II. Using a bilayer die, these polymers were extruded at 270° C. such that the films are laminated to form a sheet. The sheet was wound about a cooling drum having a surface temperature of 40° C. so as to solidify the sheet. The resulting sheet was then stretched in the longitudinal direction at 125° C. at a stretching ratio of 4.5 times the original length and then in the transverse direction in a tenter at 165° C. at a stretching ratio of 10 times the original length, followed by heat-setting at 160° C. allowing 5% relaxation to obtain a film having a thickness of 18 μm. The thus obtained laminate film had a polypropylene base layer having a thickness of 15 μm and an ethylene/propylene/butene copolymer layer (heat-sealing layer) with a thickness of 3 μm. After performing corona discharge treatment in the mixed gas atmosphere of $N_2/CO_2$ with an electric energy of 15 W·min/m$^2$ on the exposed surface of the base film, the exposed base film was metallized with aluminum and silicon in the same manner as in Example 1 to obtain a metallized film having an optical density of 2.3.

The results of evaluation of the properties of this film are shown in Table 2. As shown in Table 2, the film exhibits good prevention of permeation of water vapor and oxygen, good heat-sealing property and strong adhesion of the metallic layer, so that the film is suited as a wrapping film.

EXAMPLE 4

The same procedure as in Example 1 was repeated except that aluminum (90% by weight) and copper (10% by weight) were deposited in place of aluminum and silicon. A metallized film having an optical density of 2.3 was obtained.

The results of the evaluation of the properties of the film are shown in Table 2. As can be seen from Table 2, since Al and Cu metals are deposited, the prevention of permeation of water vapor and oxygen is good.

EXAMPLE 5

The same procedure as in Example 1 was repeated except that the heat-sealing layer and the surface layer to be metallized were made of ethylene/propylene copolymer (ethylene content: 2% by weight; MFR 6.5 g/10 minutes) and that the deposited metal was aluminum (90% by weight) and magnesium (10% by weight). The optical density of the metallized film was 1.8.

The results of the evaluation of the properties of the film are shown in Table 2. As shown in Table 2, since Al and Mg metals are deposited, the film exhibits good prevention of permeation of water vapor and oxygen, good heat-sealing property and strong adhesion of the metallic layer, so that the film is suited as a wrapping film.

EXAMPLE 6

Polyethylene terephthalate for forming the base film was fed into an extruder I and copolymer of ethylene glycol, terephthalic acid and isophthalic acid for forming the heat-sealing layer was fed into an extruder II. These polymers were co-extruded at 280° C. and the extruded sheet was wound about a cooling drum having a surface temperature of 25° C. so as to solidify the sheet. The resulting sheet was stretched in the longitudinal direction at 80° C. at a stretching ratio of 3 times the original length and then in the transverse direction in a tenter at 130° C. at a stretching ratio of 3.3 times the original length, followed by heat-setting at 200° C. allowing 5% relaxation to obtain a laminate film having a base film with a thickness of 16 μm and a heat-sealing layer with a thickness of 2 μm. After performing corona discharge treatment in the air on the exposed base film, aluminum (90% by weight) and copper (10% by weight) were vapor-deposited thereon in the same manner as in Example 1. The optical density of the resulting metallized film was 1.8.

The results of the evaluation of the properties of the film are shown in Table 2. As shown in Table 2, since Al and Cu metals are deposited, the film exhibits good prevention of permeation of water vapor and oxygen, good heat-sealing property and strong adhesion of the metallic layer. Further, the outer appearance of the metallic layer was good. Thus, the film is suited as a wrapping film.

COMPARATIVE EXAMPLE 1

Polypropylene pellets (MFR 2 g/10 minutes) were fed into an extruder and melt-extruded at 280° C. The extruded sheet was wound about a cooling drum having a surface temperature of 40° C. so as to solidify the sheet. The resulting sheet was then stretched in the longitudinal direction at 125° C. at a stretching ratio of 4.5 times the original length and then in the transverse direction in a tenter at 165° C. at a stretching ratio of 10 times the original length, followed by heat-setting at 160° C. allowing 5% relaxation to obtain a film having a thickness of 18 μm. On one surface of the thus obtained film, corona discharge treatment was performed in a mixed gas atmosphere of $N_2/CO_2$ with an electric energy of 15 W·min/m$^2$. The resulting film was wound into a roll, thereby obtaining a biaxially oriented polypropylene film.

On the surface on which the corona discharge treatment was performed, aluminum (99.98% by weight) was vapor-deposited by using a winding type vacuum vapor deposition apparatus. In the vacuum vapor-deposition process, the degree of vacuum was $2 \times 10^{-5}$ Torr, the temperature of the cooling can was $-20°$ C. and the film velocity was 300 m/min. As a result, a metallized film having an optical density of 2.3 was obtained.

The results of the evaluation of the properties of this film are shown in Table 2. As shown in Table 2, the film has no heat-sealing property and high transmittances of water vapor and oxygen, so that the film is not suited as a wrapping film.

COMPARATIVE EXAMPLE 2

The same procedure as in Example 3 was repeated except that aluminum (60% by weight) and silicon (40% by weight) were deposited.

The results of the evaluation of the properties of this film are shown in Table 2. As shown in Table 2, since the content of Si in the metallic layer is large, the adhesion of the metallic layer is weak, and the prevention of permeation of water vapor and oxygen is also not good. Thus, this film is not suited as a wrapping film.

COMPARATIVE EXAMPLE 3 by heat-setting at 160° C. allowing 5% relaxation to obtain a film having a thickness of 18 μm. The thus obtained laminate film had a polypropylene base layer having a thickness of 15 μm and an ethylene/propylene/butene copolymer layer (heat-sealing layer) with a thickness of 3 μm. After performing corona discharge treatment in the air on the exposed surface of the polypropylene base film, the surface was metallized with aluminum (99.98% by weight) by using a winding type vacuum vapor deposition apparatus. In the vacuum vapor-deposition process, the degree of vacuum was $2 \times 10^{-5}$ Torr, the temperature of the cooling can was $-20°$ C. and the film velocity was 300 m/min. The resulting metallized film had an optical density of 2.3.

The results of the evaluation of the properties of this film are shown in Table 2. As shown in Table 2, the prevention of permeation of water vapor and oxygen is bad, so that this film is not suited as a wrapping film.

TABLE 2

| | Film Structure (heat-sealing layer / base layer / metallic layer) | Deposited Metal (Weight ratio in parentheses) | O. D. | Water Vapor Transmittance (g/100 inch$^2$/Day/18 μm) | Oxygen Transmittance (ml/100 inch$^2$/Day/18 μm) |
|---|---|---|---|---|---|
| Example 1 | EPBC/PP/EPC | Al Si (94.5, 5.5) | 2.0 | 0.014 | 3.5 |
| Example 2 | EPBC/PP/acrylic polymer coating | Al Si (94.5, 5.5) | 2.1 | 0.012 | 1.0 |
| Example 3 | EPBC/PP | Al Si (94.5, 5.5) | 2.3 | 0.017 | 3.0 |
| Example 4 | EPBC/PP/EPC | Al Cu (90, 10) | 2.3 | 0.018 | 4.3 |
| Example 5 | EPC/PP/EPC | Al Mg (90, 10) | 1.8 | 0.019 | 4.9 |
| Example 6 | PETI/PET | Al Cu (90, 10) | 1.8 | 0.011 | 0.03 |
| Comparative Example 1 | PP | Al (99.98) | 2.3 | 0.076 | 1.4 |
| Comparative Example 2 | EPBC/PP | Al Si (60, 40) | 1.8 | 0.10 | 30 |
| Comparative Example 3 | EPBC/PP | Al (99.98) | 2.3 | 0.090 | 20 |

| | Adhesion Index of Mettalic Layer | Outer Appearance of Mettalic Layer | Heat-Sealing Strength (g/cm) | Suitability as Wrapping Film |
|---|---|---|---|---|
| Example 1 | 5.0 | ○ | 250 | ⊚ |
| Example 2 | 4.0 | ○ | 250 | ⊚ |
| Example 3 | 4.5 | ○ | 250 | ⊚ |
| Example 4 | 4.5 | ○ | 250 | ⊚ |
| Example 5 | 4.5 | ○ | 150 | ○ |
| Example 6 | 5.0 | ○ | 200 | ⊚ |
| Comparative Example 1 | 4.0 | ○ | 0 | x |
| Comparative Example 2 | 3.5 | x | 250 | x |
| Comparative Example 3 | 3.5 | ○ | 250 | x |

EPBC: ethylene/propylene/butene copolymer
PP: polypropylene
EPC: ethylene/propylene copolymer
PETI: polyethylene terephthalate/isophthalate
PET: polyethylene terephthalate Polypropylene pellets (MFR 2 g/10 minutes) for forming the base film were fed into an extruder I, and ethylene/propylene/butene copolymer (ethylene content: 3% by weight; propylene content: 4.5% by weight) for forming the heat-sealing layer was fed into an extruder II. Using a bilayer die, these polymers were extruded at 270° C. such that the films are laminated to form a sheet. The sheet was wound about a cooling drum having a surface temperature of 40° C. so as to solidify the sheet. The resulting sheet was then stretched in the longitudinal direction at 125° C. at a stretching ratio of 4.5 times the original length and then in the transverse direction in a tenter at 165° C. at a stretching ratio of 10 times the original length, followed

We claim:
1. A metallized wrapping film comprising:
a plastic base film;
a heat-sealing layer formed on one surface of said base film; and
a metallic layer formed on another surface of said base film opposite to said one surface on which said heat-sealing layer is formed, said metallic layer consisting essentially of 70-99% by weight of aluminum and one or more elements selected from the elements having an atomic number of 12 -30 excluding aluminum, said metallized wrapping film having an optical density of 1.0 to 3.0.

2. The film of claim 1, wherein said one or more elements are selected from the group consisting of Mg, Si, Ca, Ti, Fe, Co, Ni, Cu and Zn.

3. The film of claim 2, wherein said one or more elements are selected from the group consisting of Mg, Si, and Cu.

4. The film of claim 1, wherein said metallic layer contains aluminum in an amount of 80–95% by weight.

5. The film of claim 1, which has an optical density of 1.5–2.5.

6. The film of claim 1, which has a water vapor transmittance of not more than 0.025 g/(100 inch$^2$·24 hrs·18 μm).

7. The film of claim 1, which has an oxygen transmittance of not more than 5 ml/(100 inch$^2$·24 hrs·18 μm).

8. The film of claim 1, wherein said basic film is a polyolefin film.

9. The film of claim 8, wherein said polyolefin film is polypropylene.

10. The film of claim 1, wherein said base film has a coating layer containing an acrylic polymer, on which said metallic layer is formed.

* * * * *